(12) United States Patent
Calame et al.

(10) Patent No.: US 11,960,205 B2
(45) Date of Patent: *Apr. 16, 2024

(54) METHOD FOR MANUFACTURING A HOROLOGY COMPONENT

(71) Applicant: ROLEX SA, Geneva (CH)

(72) Inventors: Florian Calame, Epalinges (CH); Alexandra Maegli, Geneva (CH); Xavier Multone, Lausanne (CH)

(73) Assignee: ROLEX SA, Geneva (CH)

( * ) Notice: Subject to any disclaimer, the term of this patent is extended or adjusted under 35 U.S.C. 154(b) by 664 days.

This patent is subject to a terminal disclaimer.

(21) Appl. No.: 16/718,573

(22) Filed: Dec. 18, 2019

(65) Prior Publication Data

US 2020/0201172 A1 Jun. 25, 2020

(30) Foreign Application Priority Data

Dec. 21, 2018 (EP) ..................... 18215100

(51) Int. Cl.
*G03F 7/00* (2006.01)
*G03F 7/40* (2006.01)

(52) U.S. Cl.
CPC .......... *G03F 7/0017* (2013.01); *G03F 7/0035* (2013.01); *G03F 7/0037* (2013.01); *G03F 7/405* (2013.01)

(58) Field of Classification Search
CPC .... G03F 7/0017; G03F 7/0015; G03F 7/0035; G03F 7/0037
See application file for complete search history.

(56) References Cited

U.S. PATENT DOCUMENTS

| 9,302,430 B2 | 4/2016 | Thiel et al. |
| 10,088,748 B2 | 10/2018 | Calame |

(Continued)

FOREIGN PATENT DOCUMENTS

| CN | 101625542 A | 1/2010 |
| CN | 101918617 A | 12/2010 |

(Continued)

OTHER PUBLICATIONS

Chinese Office Action and Search Report dated Jun. 10, 2022 in counterpart application No. CN201911338363.5; w/English machine translation (total 13 pages) (Note: EP2672319, D1 cited in the Chinese Office Action, and EP2405300, D1 cited in the Chinese Search Report and HK1220859 (WO2017148394), D5 cited in the Chinese Search Report, are not listed in this IDS since they were already listed in the IDS filed Feb. 16, 2022 and Aug. 18, 2019, respectively).

(Continued)

*Primary Examiner* — Daborah Chacko-Davis
(74) *Attorney, Agent, or Firm* — Seckel IP, PLLC

(57) ABSTRACT

Method for manufacturing a horology component, including manufacturing (E1) a first structure (10) from a first photosensitive resin (31) having at least one layer of photosensitive resin having a first pattern obtained by polymerizing the first photosensitive resin by irradiation through at least one mask (4), then developing the first photosensitive resin; and transforming (E2) the first structure (10) into a second structure (1) by structuring at least one surface of the first structure by the addition of a second photosensitive resin (32) to the at least one surface, the second structure (1) being intended to at least partially form a manufacturing mold for the horology component.

20 Claims, 6 Drawing Sheets

(56) References Cited

U.S. PATENT DOCUMENTS

| | | |
|---|---|---|
| 2003/0057096 A1 | 3/2003 | Morales et al. |
| 2004/0231159 A1 | 11/2004 | Shibuya et al. |
| 2005/0167072 A1 | 8/2005 | Kim et al. |
| 2010/0005659 A1 | 1/2010 | Dinger et al. |
| 2011/0020754 A1 | 1/2011 | Fiaccabrino |
| 2011/0104321 A1 | 5/2011 | Zhang et al. |
| 2016/0178807 A1 | 6/2016 | Sagardoyburu |
| 2016/0179000 A1 | 6/2016 | Calame |
| 2018/0363159 A1 | 12/2018 | Audren et al. |
| 2019/0032233 A1 | 1/2019 | Wang et al. |
| 2020/0201173 A1 | 6/2020 | Calame et al. |

FOREIGN PATENT DOCUMENTS

| | | |
|---|---|---|
| EP | 2405300 A1 | 1/2012 |
| EP | 2672319 A1 | 12/2013 |
| EP | 3035125 A1 | 6/2016 |
| EP | 3037897 A1 | 6/2016 |
| EP | 3260932 A1 | 12/2017 |
| FR | 2757961 A1 | 7/1998 |
| JP | H7-505061 A | 6/1995 |
| JP | 2005-520691 A | 7/2005 |
| JP | 2011-502817 A | 1/2011 |
| JP | 2016057283 A | 4/2016 |
| JP | 2016-176714 A | 10/2016 |
| WO | 9310686 A1 | 6/1993 |
| WO | 2003027355 A1 | 4/2003 |
| WO | 2017102661 A1 | 6/2017 |
| WO | 2017148394 A1 | 9/2017 |

OTHER PUBLICATIONS

European Search Report and Written Opinion dated Jun. 13, 2019 issued in counterpart application No. EP18215100; w/ English machine translation (total 14 pages).

Eschenbaum et al., "Hybrid lithography: Combining UV-exposure and two photon direct laser writing", Optics Express, vol. 21, No. 24, 2013, pp. 29921-29926 (in English; cited in the ESR).

European Office Action dated Jan. 26, 2022 in counterpart application No. EP18215100; w/ English machine translation (total 8 pages).

Office Action dated May 12, 2022 in co-pending U.S. Appl. No. 16/718,573; with PTO892 (total 15 pages) (note: ref.A, U.S. Appl. No. 16/718,573 cited in the Office Action is not listed in this IDS since it is the publication of this U.S. Appl. No. 16/718,573).

European Search Report and Written Opinion dated Oct. 25, 2019 issued in application No. EP18215108, counterpart of co-pending U.S. Appl. No. 16/718,578; w/ English machine translation (total 31 pages).

Japanese Office Action dated Nov. 14, 2023 in application JP 2019-228082, counterpart of co-pending U.S. Appl. No. 16/718,578—now U.S. Pat. No. 11,803,121 (with English machine translation; total 20 pages) (note: cited in this JP Office Action but not listed in this IDS form are D1, Carsten Eschenbaum et al. 2013, D3, WO2017148394, and D9, EP3260932 since they were already listed in the IDS filed Dec. 18, 2019; and D2.

Japanese Office Action dated Nov. 14, 2023 in counterpart application JP 2019-228070; with English machine translation (total 15 pages) (note: D1, Carsten Eschenbaum et al. 2013, D2, WO2017148394, and D6, EP3260932 cited in the JP Office Action are not listed in this IDS since they were already listed in the IDS filed Dec. 18, 2019).

METHOD FOR MANUFACTURING A HOROLOGY COMPONENT

This application claims priority of European patent application No. EP18215100.1 filed Dec. 21, 2018, the content of which is hereby incorporated by reference herein in its entirety.

The present invention relates to a method for manufacturing a horology component.

Photolithography is a technique commonly employed in the manufacture of horology components, in particular making it possible to form a resin mold used for the manufacture of the horology components.

Patent EP2405300 describes, for example, the implementation of a method for manufacturing an at least two-level metallic piece part using the photolithography technique.

Document EP3035125 proposes an improved method for manufacturing a multilevel horology component, using the photolithography technique.

Document EP3260932 describes a method for manufacturing a horology component made of polycrystalline ceramic, in which method a mold formed by photolithography is used.

These approaches of the prior art which are based on so-called traditional photolithography nevertheless have the disadvantage of not making it possible to produce absolutely any three-dimensional shape, such as shapes that are complex on a micrometric or even nanometric scale.

Thus, one object of the present invention is to improve the methods known from the prior art and to propose a solution for the manufacture of a three-dimensional horology component, possibly of a shape that is complex on a micrometric or even nanometric scale. Another object of the invention is to allow the manufacture of a horology component with a high level of reliability and high precision.

To this end, the invention relates to a method for manufacturing a horology component, characterized in that it comprises the following steps:

Manufacturing a first structure from a first photosensitive resin comprising at least one layer of photosensitive resin comprising a first pattern obtained by polymerizing the first photosensitive resin by irradiation through at least one mask, then developing said first photosensitive resin;

Transforming the first structure into a second structure by structuring at least one surface of the first structure by the addition of a second photosensitive resin to said at least one surface, said second structure being intended to at least partially form a manufacturing mold for said horology component. This step advantageously employs the two-photon polymerization technique.

The invention is more particularly defined by the claims.

The invention also relates to a horology component as such.

These objects, features and advantages of the present invention will be set out in detail in the following description of particular embodiments, given by way of nonlimiting example with reference to the attached figures among which:

The invention implements a method for manufacturing a horology component which advantageously combines at least one step based on traditional photolithography with at least one step based on the two-photon polymerization technique, known by its abbreviation TPP. This method is, for example, used in the method described in document U.S. Pat. No. 9,302,430, in a field distant from horology. Ultimately it can be likened to a particular, three-dimensional, form of photolithography very different from traditional photolithography.

More particularly, the invention implements a method of manufacture comprising at least a first step consisting in manufacturing E1 a first structure on a substrate, using the traditional photolithography technique, and a second step advantageously consisting in transforming E2 the first structure into a second structure, by a structuring of at least one surface of the first structure, notably using the two-photon polymerization technique.

Figure 1:
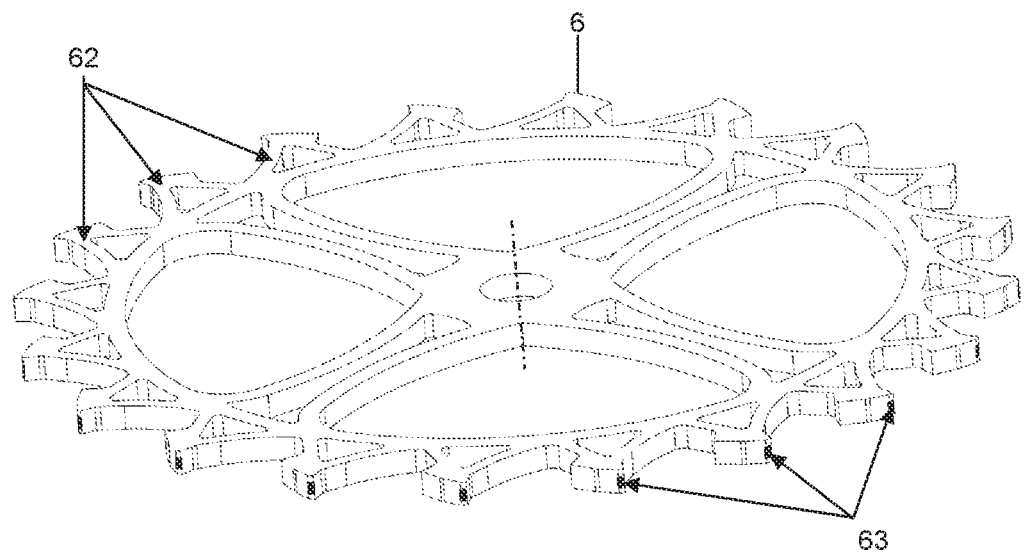
FIG. 1 depicts a perspective view of an escape wheel produced by a method of manufacture according to one embodiment of the invention.
Figure 2:
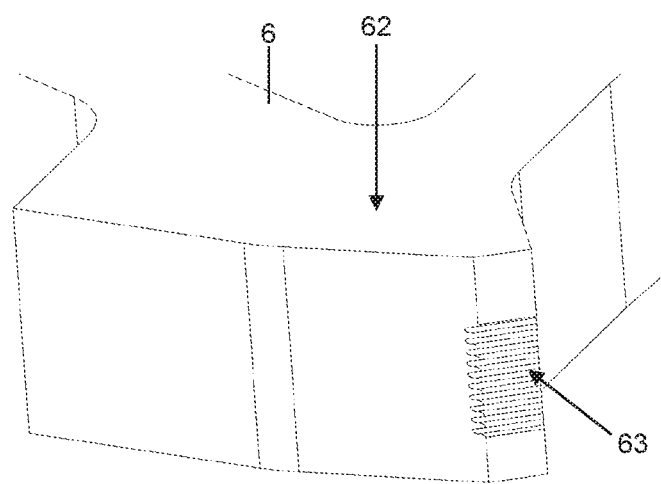
FIG. 2 depicts an enlarged perspective view of a tooth of the escape wheel of FIG. 1, produced by a method of manufacture according to one embodiment of the invention.

The method of manufacture according to one embodiment of the invention will be illustrated in the context of the manufacture of an escape wheel 6 depicted in FIGS. 1 and 2. This escape wheel 6 is made, for example, of a nickel phosphorus (NiP) alloy and comprises teeth 62 comprising microstructures 63 on their contact surfaces, which are designed to constitute channels for guiding a lubricant. This wheel, and notably the microstructured surfaces of the teeth 62, have a very complex geometry, which can advantageously be obtained by the method of manufacture according to the embodiment that will now be described.

Specifically, we shall describe an embodiment of a method for manufacturing a horology component, with reference to FIGS. 3 to 8, which is particularly suited to the manufacture of an escape wheel as described hereinabove, and more generally suited to the manufacture of any horology component.

According to this embodiment, the method comprises a first step that consists in manufacturing E1 a first structure 10 on a substrate 20, using the traditional photolithography technique.

By convention, the horizontal direction will be defined as being a direction parallel to the plane of the substrate 20. The vertical direction is defined as being the direction perpendicular to the horizontal direction, and therefore perpendicular to the plane of the substrate.

This substrate 20 may take the form of a wafer made of metal, such as a stainless steel, or take the form of a silicon wafer, or a glass wafer, or a ceramic wafer. It is advantageously planar. It may optionally comprise structures which are produced, for example, by laser machining. These structures may, for example, include patterns, notably machined patterns, and/or cavities. The substrate is prepared in accordance with the rules known to those skilled in the art, notably with regards to degreasing it, cleaning it, possibly passivating and/or activating it. As a preference, the substrate 20 is provided with reference marks so that it can be positioned with great precision. The substrate 20 may be manufactured from a conducting material, for example a stainless steel. As an alternative, it might also be possible to use a substrate made from a non-conducting material, such as silicon for example. In that case, a conducting layer 21 may be applied to the upper surface of the substrate 20, for example using thermal evaporation, in a preliminary step performed prior to the first step E1. This conducting layer 21 is notably intended to act as an electrode to strike electroplating, or electrodeposition, for the purpose of future metal growing of the component, as will be described in detail hereinafter. In a known way, this conducting initiating layer 21 may comprise a sublayer of chrome, of nickel or of titanium, covered with a layer of gold or of copper, and thus exhibit the form of a multilayer structure.

The first step comprises a substep that consists in applying E11 a first photosensitive resin 31 so that it covers all or part of the upper surface of the conducting layer 21 of the substrate 20 (or directly covers the upper surface of the substrate 20, in the absence of a conducting layer 21) with a layer of a first photosensitive resin 31 over a desired height, in accordance with the rules known by those skilled in the art. This first photosensitive resin 31 is suited to traditional photolithography. It may be negative or positive. In the case of the former, it is designed to become insoluble or soluble only with difficulty to a developer under the action of radiation (i.e., the exposed zones resist development), whereas in the case of the latter, it is designed to become soluble to a developer under the action of a radiation, whereas the part not exposed to the radiation remains insoluble or soluble only with difficulty. This photosensitive resin 31 may be of the SU-8 type, which is a negative photosensitive resin which becomes polymerized under the action of UV radiation, for example resin SU-8-100 by Microchem.

Figure 3:
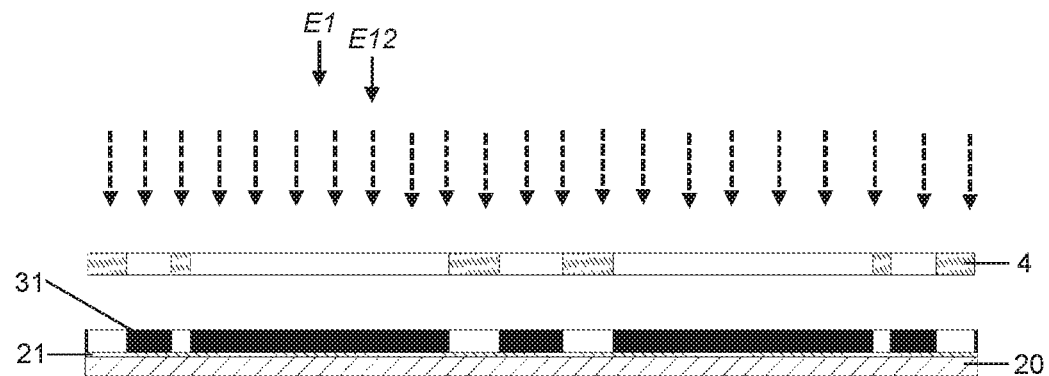
FIGS. 3 to 8 illustrate successive steps in a method of manufacturing the escape wheel depicted in FIGS. 1 and 2 according to one embodiment of the invention.
Figure 4:
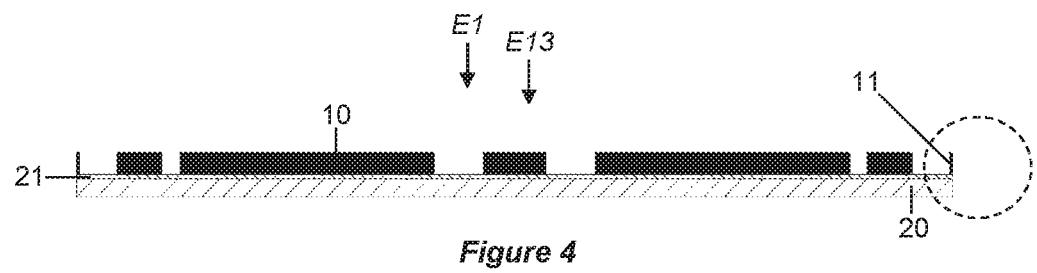

The first step then comprises a substep that consists in exposing E12 the first photosensitive resin 31 through a mask 4, notably using a UV radiation, X-ray radiation or a beam of electrons, in a direction substantially perpendicular to the mask, in order to polymerize it according to a first pattern defined by the mask 4, as illustrated in FIG. 3. This exposure consists in exposing the layer of photosensitive resin 31 to light radiation through the mask 4 comprising openings and opaque zones. This mask thus defines the first pattern that is to be reproduced in order to create the structure or a portion of the structure. The radiation used is perpendicular or substantially perpendicular to the plane in which the mask extends, and perpendicular or substantially perpendicular to the substrate 20, so that only the zones of resin situated immediately in line with the openings formed in the mask are irradiated. These zones are thus defined by vertical or substantially vertical walls, namely walls that are perpendicular or substantially perpendicular to the plane of the substrate 20. Alternatively, a mask having variations in transmittance can be used to form walls that are non-vertical or inclined.

Next, the first step comprises a substep that consists in developing E13 the first photosensitive resin 31. In the case where the resin 31 is a negative resin, development consists in eliminating the unexposed (i.e. non-irradiated) zones of resin, according to a method suited to the photosensitive resin 31, for example by dissolving them using a chemical product or using a plasma process. As an alternative, in the case of a positive photosensitive resin, the irradiated zones are eliminated during development for example via a chemical route and the non-irradiated zones are kept on the substrate. After development, the substrate 20 or the optional conducting layer 21 is revealed at the places from which the resin has been eliminated. The remaining parts of resin thus form a first structure 10, illustrated by FIG. 4. This structure rests on the upper surface of the substrate 20 or on the conducting layer 21, if any, of the substrate 20. The first structure 10 therefore extends between two horizontal surfaces, an upper one (defined as being the interface between the polymerized resin and the air) and a lower one (defined as being the interface between the polymerized resin and the upper surface of the substrate 20 or of the optional conducting layer 21), and comprises lateral surfaces 11, extending between these two horizontal surfaces, which are generally substantially vertical but which could as an alternative be inclined. These lateral surfaces are notably the result of the openings formed in the first photosensitive resin 31 by the removal of non-polymerized photosensitive resin using traditional photolithography. For preference, the first structure 10 has a constant height (measured between the two, upper and lower, surfaces).

In order to create a multi-layer structure, the first step E1 may involve repeating the substeps described hereinabove, with different masks, featuring different first sub-patterns, the result of which creates the first structure with a first pattern corresponding to the combination of the various first sub-patterns.

The method then comprises a second step that consists in transforming E2 the first structure 10 into a second structure 1 by structuring at least one surface of the first structure 10, notably at least one lateral surface 11 of the first structure 10. This step involves the addition of a second three-dimensional pattern 12 in polymerized resin to said at least one surface.

Figure 5:
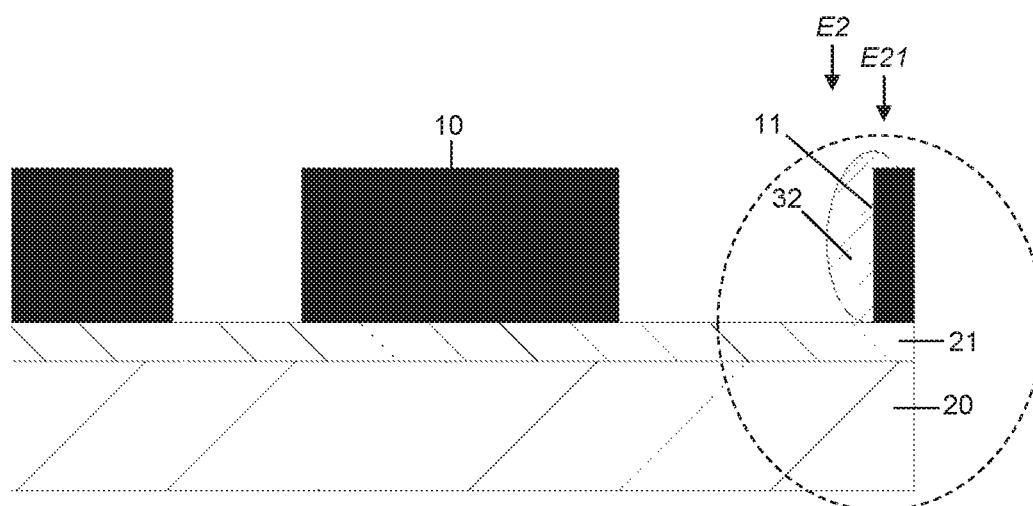

The second step thus comprises a substep consisting in applying E21 a layer of a liquid or semiliquid second photosensitive resin 32 on at least part of the at least one aforementioned surface of the first structure 10, notably a lateral surface 11, as illustrated in FIG. 5. This step may, for example, be performed by drop casting or any other means that allows the application of liquid or semiliquid resin (spray coating, spin coating, etc.). The second photosensitive resin 32 is particularly suited to the aforementioned two-photon polymerization technique. It may be negative or positive. In one particular embodiment, the photosensitive resin 32 used is a semiliquid resin, for example an IP-Dip™ resin by Nanoscribe, which is a negative resin. The embodiment is not restricted to the above description. The aforementioned surface of the first structure could as an alternative or in addition be horizontal, and not solely a lateral surface, notably in the case of the manufacture of a multi-level horology component.

As an alternative, the first and second photosensitive resins 31, 32 may be identical. The resin then used for the two steps E1, E2 is suited both to traditional photolithography and to two-photon polymerization.

Figure 6:
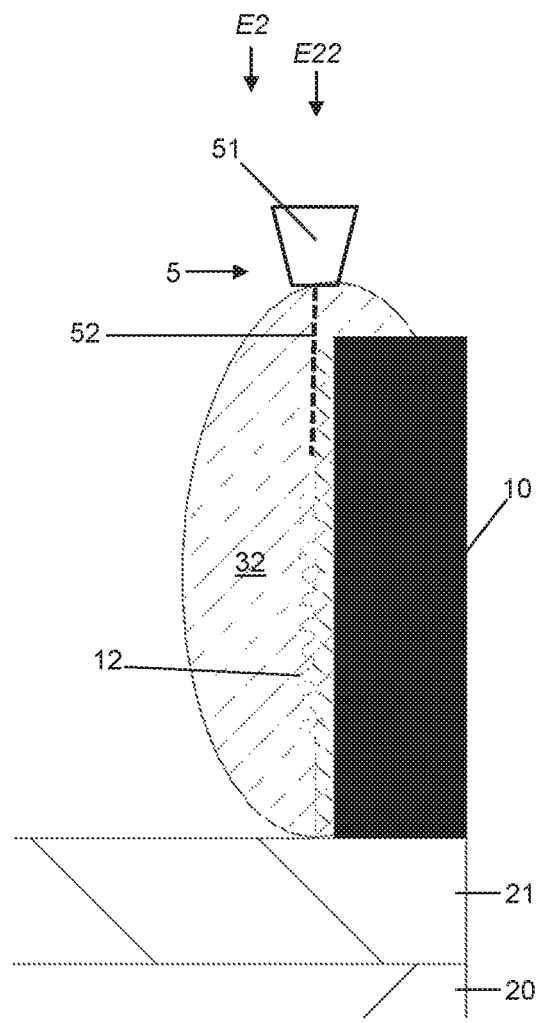

The second step then comprises a substep consisting in performing two-photon polymerization E22 on at least part of the layer of the second photosensitive resin 32, as illustrated in FIG. 6, in order to achieve three-dimensional polymerization according to a predefined second three-dimensional pattern. For that, the method may employ a photon device 5, which is intended to emit electromagnetic waves onto or into the photosensitive resin 32, so as to polymerize it according to spatial coordinates which correspond to the second pattern. The benefits of this method are the precision of the definition and the complexity of the patterns that can be achieved, such as notably patterns that are not continuous in the vertical direction.

According to one advantageous embodiment, the photon device 5 comprises an objective 51 which is at least partially immersed in the second photosensitive resin 32 so as to polymerize it according to spatial coordinates that define the shape or the three-dimensional geometry 12 of the second pattern. Such an alternative form advantageously makes it possible to optimize the resolution of the second three-dimensional pattern. More particularly, the objective 51 is designed to direct and focus a laser beam 52 so that the focal point passes through the various spatial coordinates that define the shape or the geometry 12 of the second pattern. For each of the coordinates, two photons may be absorbed simultaneously by the resin 32, in a very small volume known as a "voxel" at the focal point of the laser 52. A chemical reaction is initiated, the liquid or semiliquid resin polymerizes and becomes solid within the voxel. The voxels resulting from the path of the focus of the laser beam 52 thus define the shape or the geometry 12 of the second pattern. When combining the focusing optic of the laser and the material of the photosensitive resin 32 to advantageous effect, the diameter of the voxel can be smaller than 0.1 µm, thus making it possible to define very high-resolution microstructurings or even nanostructurings on the at least one surface, notably on the at least one lateral surface 11, of the first structure 10. This step thus makes it possible to define a second pattern with a three-dimensional resolution of 0.001 µm$^3$ or better, and a lateral resolution equivalent to the diameter of the voxel, namely of 0.1 µm or better.

In addition, the at least partial or total immersion of the objective 51 in the second photosensitive resin 32 prevents the laser beam 52 to cross an interface between the objective and the air and an interface between the air and the second photosensitive resin, and avoids a deflection of the laser beam at said interfaces. The laser beam (photons beam) interacts exclusively with the second photosensitive resin: it is processed in a continuous medium, avoiding any parasitic reflection or refraction or power loss. In consequence, the path of the laser beam is minimized, and the detection of the already polymerized part is easier. It results that three-dimensional resolution of the second pattern is optimized, and that the processing speed is maximized.

Furthermore, as depicted in FIG. 6, this second pattern may extend at least in part in a horizontal direction, or have a significant horizontal component, from an application of second photosensitive resin 32 on a lateral surface 11 of the first structure 10, notably on a surface perpendicular or substantially perpendicular to the substrate 20.

Figure 7:
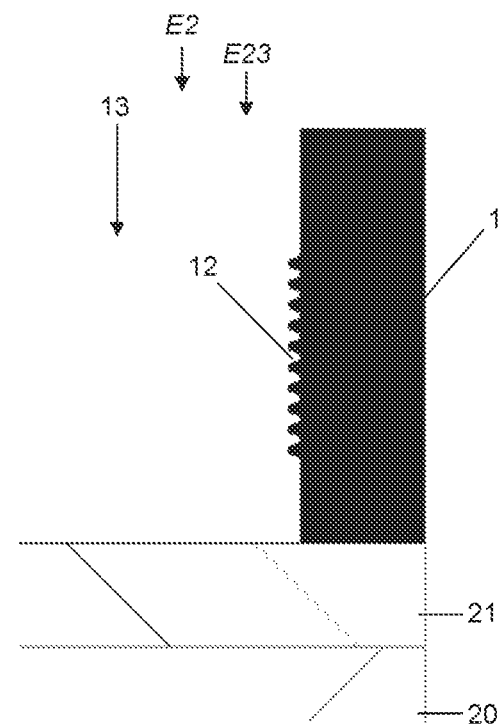

This step may therefore form microstructurings, or even nanostructurings, which may, for example, adopt the shape of squarewaves or staircases 12 on the surface 11, as illustrated in FIG. 7. These shapes do not cut into the surface 11, but are applied in relief on the surface 11.

The second step then comprises a substep consisting in developing E23 the second photosensitive resin 32 to eliminate the non-polymerized second photosensitive resin 32 and obtain the second structure 1 of a shape defined by the first and second patterns. Specifically, once the second photosensitive resin 32 has been polymerized according to the predefined three-dimensional geometry, those zones of photosensitive resin 32 that have not been exposed are eliminated, in the case of a negative photosensitive resin, for example by dissolving them in a chemical product, or using a plasma process. As a preference, the chemical product used is the same as the one used in the first step. This may, for example, be a PGMEA-based solvent.

At the end of this second step, the combination of the two photosensitive resins 31, 32 shaped respectively into the aforementioned two patterns finally forms a second structure 1 attached to the substrate 20. According to the embodiment, this second structure 1 is intended to form, together with the substrate 20, a mold for the manufacture of a horology component. To this end, it may comprise at least one cavity 13. As a result of the above-described method, it is possible to form a second structure 1 that has absolutely any complex three-dimensional shape, and therefore allows the creation of absolutely any horology component having a corresponding complex three-dimensional shape.

The method of manufacture then implements a third step which consists in using E3 the second structure 1, together with the substrate 20, as a mold for the manufacture of the horology component 6. The latter may notably be made of metal or metal alloy or ceramic, notably technical ceramic or composite material. It may possibly be reinforced by fibers, such as carbon fibers or Kevlar, for example.

According to a first alternative form of embodiment, the horology component 6 is made of metal or of metal alloy.

Figure 8:
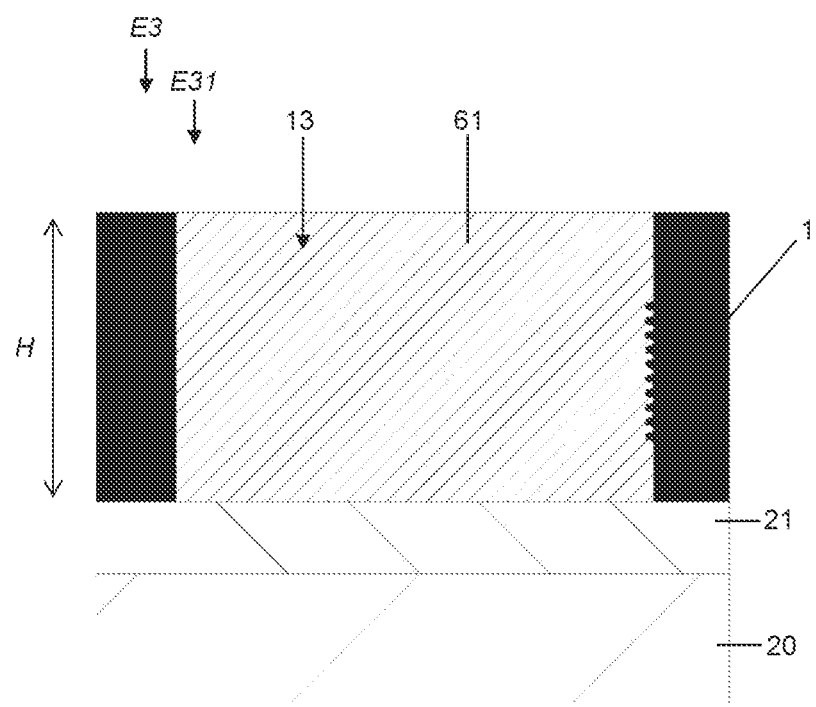

In this first alternative form of embodiment, the third step comprises a substep consisting in applying E31 a layer of metal 61 forming the horology component, by electrodeposition or electroplating, into the cavity or cavities 13 of the second structure 1, as illustrated in FIG. 8. In this substep, the aforementioned conducting layer 21 or the substrate 20 itself if it is made from a conducting material, acts as the cathode to initiate the deposition reaction. This step uses, for example, the LIGA method and a metal or a metal alloy such as, for example, nickel (Ni) or nickel-phosphorus (NiP) or a nickel-based material. Advantageously, an alloy as described in document WO2017102661 may be used. The layer of metal 61 obtained preferably has the same height H as that of the mold formed by the second structure 1. It may also have a height less than the height of the mold, or even a height greater than the height of the mold. Optionally, this substep may comprise a thickness adjustment, by simultaneous mechanical polishing of the metal layer and of the mold, in order to obtain a perfectly planar horizontal upper surface.

Furthermore, the layer of metal 61 obtained preferably has a height H substantially greater than that of the layer 21. It is preferably greater than five times the height of the layer 21, or even greater than ten times the height of the layer 21.

In this first alternative form of embodiment, the third step comprises a substep consisting in separating E32 the assembly formed by said layer of metal 61 and the second structure 1 from the substrate 20, for example by delaminating the conducting layer 21 from the substrate.

In this first alternative form of embodiment, the third step comprises a substep consisting in separating E33 the horology component 6, formed by said layer of metal 61, from the second structure 1, for example by chemical attack or using a plasma. The horology component 6 is thus released.

The steps E32 and E33 may be performed in any order.

According to a second alternative form of embodiment, the horology component 6 is made of ceramic, notably of technical ceramic.

In this second alternative form of embodiment, the third step comprises a substep consisting in using a liquid route to fill E31' the second structure with a product containing ceramic powder. This step may, for example, involve pouring a slurry or pouring a gel or pouring a coagulation. Alternatively, this step may be implemented using electrophoresis in the case of a substrate made of a conducting material or in which the upper surface of the substrate is covered with a conducting layer 21. In the case of a slurry, this may contain a liquid substance, ceramic powder and at least one additive. The liquid substance may contain water, an alcohol or another organic solvent. The ceramic powder may for example comprise a zirconia or an alumina or an oxide or a carbide or a nitride. This step may be performed under vacuum in order to ensure perfect filling without inclusions of air.

This substep E31' may be preceded by an optional substep that consists in preparing at least a surface portion of the substrate 20 facing at least one cavity 13 of the second structure 1, or in applying a coating to at least a surface portion of the substrate 20 facing at least one cavity 13 of the second structure 1, with a view to making the future release of a blank of the horology component 6 easier. Note that this blank may, for example, take the form of the green body that is the precursor of the horology component 6.

In this second alternative form of embodiment, the first step comprises a substep consisting in consolidating E32' the product positioned in the second structure 1. This substep comprises the drying of the slurry in order to obtain a blank of the horology component 6.

An optional intermediate substep may consist in adjusting the height of the blank of the horology component 6, prior to release of the mold. This blank may, for example, take the form of the green body that is the precursor of the horology component 6.

In this second alternative form of embodiment, the third step comprises a substep that consists in separating E33' the blank of the component from the manufacturing mold formed by the second structure, and in separating the blank of the component from the substrate 20, these two separations being able to be performed in any order. This separation may for example be achieved by chemical attack or by treatment using a plasma.

In this second alternative form of embodiment, the third step finally comprises a substep consisting in debinding the blank obtained in the previous step, and then in densifying it E34' by sintering. As a preference, the substrate 20 is made of a material intended to withstand the temperatures at which the substeps of the third step E3' are performed. For example, the substrate may be made of silicon or of alumina.

Figure 9:
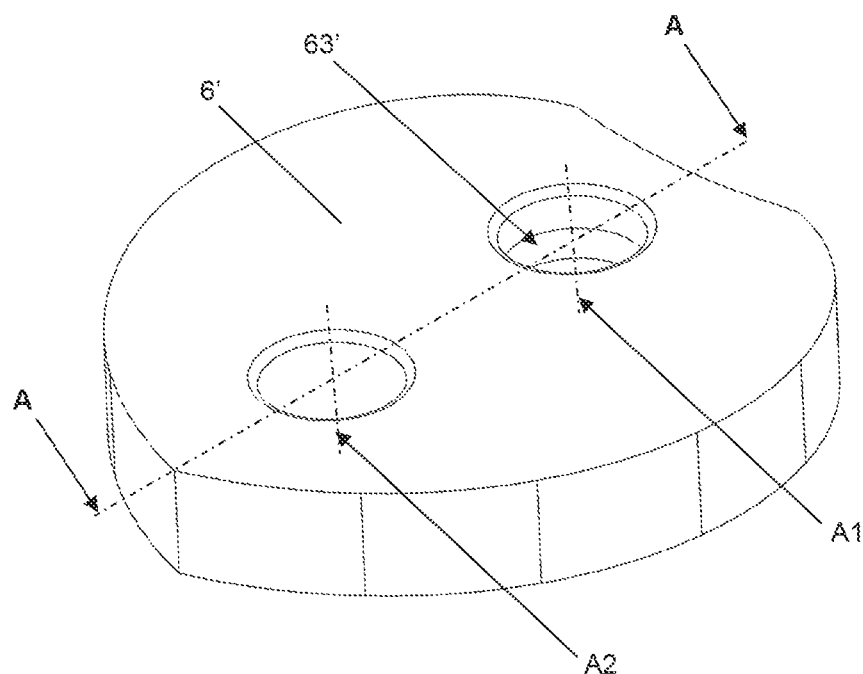
FIG. 9 depicts a perspective view of a heart-shaped horology component produced by a method of manufacture according to one embodiment of the invention.
Figure 10:
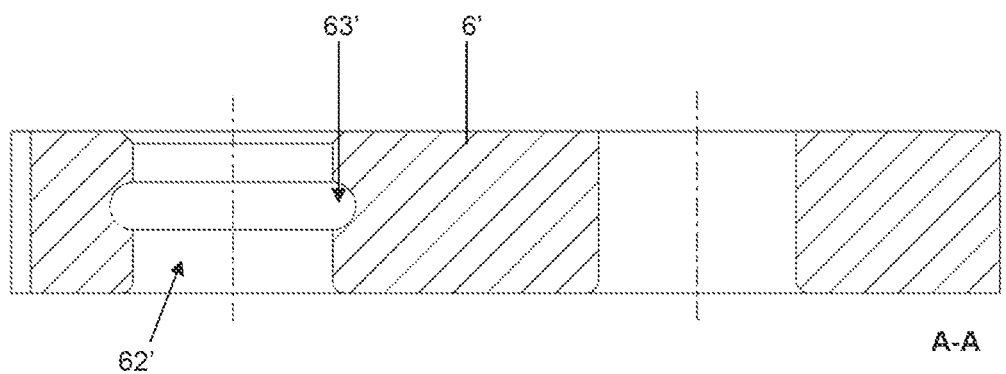
FIG. 10 depicts a cross-sectional view on a plane A-A of the horology component of FIG. 9.
Figure 11:
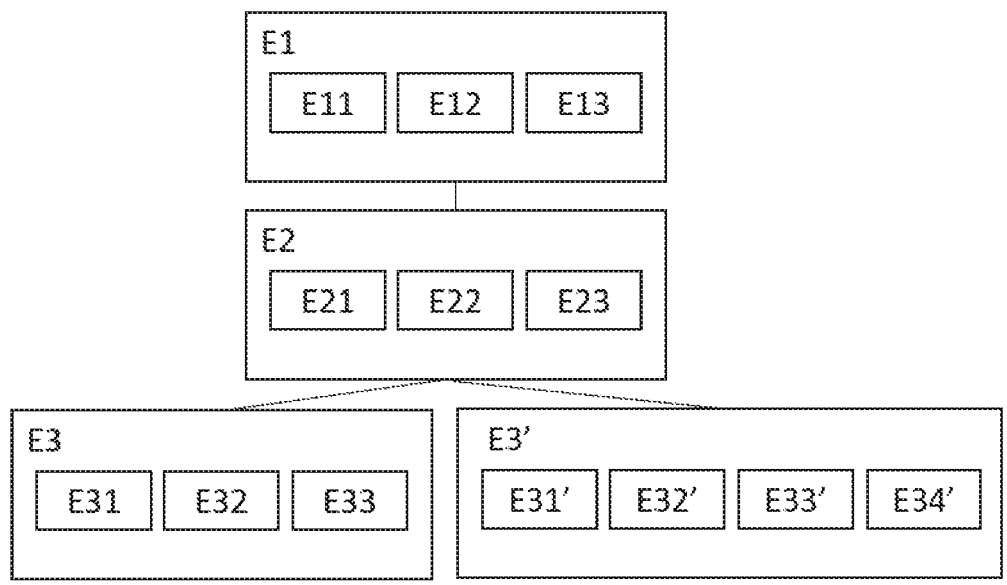
FIG. 11 illustrates a flow diagram schematically depicting the steps and substeps of one embodiment of the invention according to two distinct alternative forms.

The method for manufacturing a horology component described hereinabove may be used to manufacture all horology components such as, by way of illustrative and nonlimiting examples, a balance, a pallet, a jumper, a pinion, a wheel, a lever, a spring, a cam or even a blank. It may notably naturally be used to manufacture any element comprising a microstructure. FIGS. 9 and 10 thus illustrate another example of a horology component, which is in the shape of a heart 6' here. This heart is preferentially made of a technical ceramic. It has a bore 62', which comprises a groove 63'. Advantageously, such a groove 63' is provided to contain an element provided for fixing the heart to an hour wheel, such as a circlip for example. This groove may have a hemispherical shape, as is illustrated in FIGS. 9 and 10. Of course, it may have any geometry. It may, for example, have an asymmetric shape so as to best respond to the stresses caused by forces or torques.

According to the second alternative form of embodiment, the horology component is preferably made from a ceramic or composite material. Such a ceramic component is preferably made of a ceramic known as a technical ceramic. "Technical ceramics" is the name given to dense materials based on aluminum oxide; and/or on zirconium oxide; and/or on zirconium oxide stabilized notably with yttrium oxide and/or cerium oxide and/or magnesium oxide; and/or made of strontium aluminate, notably doped strontium aluminate; and/or of nitrides; and/or of carbides; and optionally be pigmented notably using metal oxides and/or mixed metal oxides and/or spinel phases. To simplify the description, we can use the term "ceramic" to refer to the "technical ceramics" of which the component 6 may be made. A material is considered to be "dense" if its density is comprised between 95 and 100% of the theoretical density of the material in question. Note that the idea of being "based on" here means that the chemical component referred to represents at least 50 wt % of the overall chemical composition of the ceramic concerned.

It is therefore apparent that the invention achieves the objectives sought by advantageously combining two different techniques. Traditional photolithography makes it possible to form the main volume of the horology component simply, quickly and reliably in a first step, and the two-photon polymerization technique allows complex shapes to be added to this main volume, in a second step that is more complex and not as quick but more precise and flexible, making it possible to define absolutely any three dimensional pattern. This results in a horology component that is complex in shape, and manufactured in a way that is simple and robust.

The invention also relates to a horology component obtained by the above-described method of manufacture. This horology component comprises a surface structured by the second pattern of the above-described second structure. The horology component is thus in the form of a one-piece part comprising the structured, or even more specifically microstructured or nanostructured, surface. In other words, the structured surface is integral with the rest of the horology component.

Advantageously, the structured surface extends at least partially over a lateral surface of the horology component. The structuring has recesses in a horizontal direction, or having a significant horizontal component. The structured surface has for example microstructurings, or even nanostructurings. These structurings may, for example, take the form of squarewaves or staircases. They are in relief, recessed into the structured surface of the horology component. This structured surface may additionally be defined with great precision. Notably, it may comprise a three-dimensional resolution less than or equal to 0.001 μm$^3$ and/or a lateral resolution (in the horizontal direction) less than or equal to 0.1 μm.

The invention claimed is:

1. A method for manufacturing a horology component, wherein the method comprises:
   manufacturing a first structure from a first photosensitive resin comprising at least one layer of photosensitive resin comprising a first pattern obtained by polymerizing the first photosensitive resin by irradiation through at least one mask, then developing said first photosensitive resin, the first structure having opposite main surfaces parallel to a main plane of the at least one layer and a lateral surface extending between the main surfaces;
   transforming the first structure into a second structure by structuring at least one portion of the lateral surface of the first structure by the addition of a second photosensitive resin to the at least one portion of the lateral surface; and
   manufacturing the horology component using a manufacturing mold, wherein the second structure forms at least a portion of the manufacturing mold,
   wherein the transforming comprises:
   (i) applying a layer of the second photosensitive resin on at least part of the at least one portion of the lateral surface of the first structure;
   (ii) performing two-photon polymerization on the second photosensitive resin in order to obtain three-dimensional polymerization according to a second pattern, using a photon device which comprises an objective lens which is at least partially immersed in the second photosensitive resin to direct and focus a beam on voxels that define a shape or a geometry of the second pattern; and (ii) developing to eliminate non-polymerized second photosensitive resin and obtain the second structure formed on the at least one portion of the lateral surface of the first structure and having a shape defined by the first and second patterns.

2. The method for manufacturing a horology component as claimed in claim 1, wherein the performing of the two-photon polymerization makes it possible to define the second pattern with a three-dimensional resolution higher than or equal to 0.001 µm$^3$ and/or with a lateral resolution higher than or equal to 0.1 µm.

3. The method for manufacturing a horology component as claimed in claim 2, wherein the manufacturing of the first structure comprises:
applying the first photosensitive resin to the upper surface of a substrate;
exposing the first photosensitive resin through a mask, in a direction perpendicular or substantially perpendicular to the mask, in order to polymerize the first photosensitive resin according to the pattern defined by the mask; and
developing the first photosensitive resin.

4. The method for manufacturing a horology component as claimed in claim 3, wherein the exposing of the first photosensitive resin generates the first structure comprising lateral flanks perpendicular or substantially perpendicular to the substrate and/or a constant cross section parallel or substantially parallel to the substrate.

5. The method for manufacturing a horology component as claimed in claim 2, wherein:
the first photosensitive resin and the second photosensitive resin are different; and/or
the first photosensitive resin and the second photosensitive resin are positive.

6. The method for manufacturing a horology component as claimed in claim 2, wherein:
the first photosensitive resin and the second photosensitive resin are identical; and/or
the first photosensitive resin and the second photosensitive resin are negative.

7. The method for manufacturing a horology component as claimed in claim 2, wherein:
the first photosensitive resin is a SU-8 resin or a SU-8-100 resin; and/or
the second photosensitive resin is a liquid or semiliquid resin.

8. The method for manufacturing a horology component as claimed in claim 2, wherein the method comprises using the second structure as the manufacturing mold.

9. The method for manufacturing a horology component as claimed in claim 1, wherein the manufacturing of the first structure comprises:
applying the first photosensitive resin to the upper surface of a substrate;
exposing the first photosensitive resin through a mask, in a direction perpendicular or substantially perpendicular to the mask, in order to polymerize the first photosensitive resin according to the pattern defined by the mask; and
developing the first photosensitive resin.

10. The method for manufacturing a horology component as claimed in claim 9, wherein the exposing of the first photosensitive resin generates the first structure comprising lateral flanks perpendicular or substantially perpendicular to the substrate and/or a constant cross section parallel or substantially parallel to the substrate.

11. The method for manufacturing a horology component as claimed in claim 9, wherein the substrate is a wafer made of a material selected from the group consisting of metal, silicon, glass, and ceramic.

12. The method for manufacturing a horology component as claimed in claim 11, wherein the wafer is made of stainless steel.

13. The method for manufacturing a horology component as claimed in claim 9, wherein the first photosensitive resin is exposed using a UV radiation, an X-radiation, or a beam of electrons.

14. The method for manufacturing a horology component as claimed in claim 9, wherein the method comprises using the second structure as the manufacturing mold.

15. The method for manufacturing a horology component as claimed in claim 1, wherein:
the first photosensitive resin and the second photosensitive resin are different; and/or
the first photosensitive resin and the second photosensitive resin are positive; and/or
the first photosensitive resin is a SU-8 resin or a SU-8-100 resin; and/or
the second photosensitive resin is a liquid or semiliquid resin.

16. The method for manufacturing a horology component as claimed in claim 1, wherein the method comprises using the second structure as the manufacturing mold.

17. The method for manufacturing a horology component as claimed in claim 16, wherein the method comprises:
filling the second structure with a pourable product containing ceramic powder;
consolidating the product to form a blank on the second structure;
separating the blank from the second structure and from a substrate; and
debinding the blank obtained in the separating, then densifying the blank by sintering.

18. The method for manufacturing a horology component as claimed in claim 16, wherein the horology component is made of a material selected from the group consisting of metal, metal alloy, ceramic, and ceramic matrix composite.

19. The method for manufacturing a horology component as claimed in claim 1, wherein the method comprises:
using electrodeposition or electroplating to apply to the second structure a layer of metal that forms the horology component; and
separating from a substrate the assembly formed by the horology component, which is formed by the layer of metal, and the second structure and separating from the second structure the horology component which is formed by the layer of metal.

20. The method for manufacturing a horology component as claimed in claim 19, wherein the metal is nickel-based or is a nickel-phosphorus alloy.

* * * * *